(12) United States Patent
Sato et al.

(10) Patent No.: US 12,426,162 B2
(45) Date of Patent: Sep. 23, 2025

(54) ELECTRIC COMPONENT

(71) Applicant: DENSO CORPORATION, Kariya (JP)

(72) Inventors: Go Sato, Kariya (JP); Taito Izaki, Kariya (JP)

(73) Assignee: DENSO CORPORATION, Kariya (JP)

( * ) Notice: Subject to any disclaimer, the term of this patent is extended or adjusted under 35 U.S.C. 154(b) by 923 days.

(21) Appl. No.: 17/645,007

(22) Filed: Dec. 17, 2021

(65) Prior Publication Data
US 2022/0201865 A1 Jun. 23, 2022

(30) Foreign Application Priority Data
Dec. 22, 2020 (JP) .................. 2020-212682

(51) Int. Cl.
H01L 23/31 (2006.01)
H01L 23/495 (2006.01)
H05K 1/18 (2006.01)

(52) U.S. Cl.
CPC ......... *H05K 1/181* (2013.01); *H01L 23/3121* (2013.01); *H01L 23/49568* (2013.01); *H05K 2201/10621* (2013.01); *H05K 2201/10954* (2013.01)

(58) Field of Classification Search
CPC ......... H05K 1/181; H05K 2201/10621; H05K 2201/10954; H05K 1/111; H05K 3/3489; H05K 1/0209; H05K 3/3436; H05K 2201/094; H05K 2201/10977; H01L 23/3121; H01L 23/49568; H01L 23/3107; H01L 23/49551; H01L 2224/48247; H01L 2924/181; H01L 23/36; H01L 23/3128; H01L 23/3672; H01L 23/3677; H01L 23/49548

See application file for complete search history.

(56) References Cited

U.S. PATENT DOCUMENTS

2004/0238934 A1* 12/2004 Warner ............... H01L 23/3114
257/E23.092
2014/0291696 A1* 10/2014 Horimoto ........... H01L 23/4334
257/77

FOREIGN PATENT DOCUMENTS

JP 4114488 B2 7/2008
JP 2018006654 A * 1/2018
JP 6569610 B2 9/2019

* cited by examiner

*Primary Examiner* — Monica D Harrison
*Assistant Examiner* — David M Helberg
(74) *Attorney, Agent, or Firm* — Maschoff Brennan

(57) ABSTRACT

An electric component includes: a semiconductor component including a heat radiating portion, a semiconductor element, a lead terminal, and a coating resin coating a part of each of the above; a wiring board including a first mounting portion, a second mounting portion, and an insulating substrate; a first solder connecting the first mounting portion and the heat radiating portion; and a second solder connecting the second mounting portion and the lead terminal. The first solder includes (a) a solder connecting portion connecting the heat radiating portion and the first mounting portion and (b) a flux provided around the solder connecting portion, and a third space which is provided as a space after excluding a second space that is an overlap of the heat radiating portion and the first mounting portion from a first space.

15 Claims, 4 Drawing Sheets

ELECTRIC COMPONENT

CROSS REFERENCE TO RELATED APPLICATION

The present application is based on and claims the benefit of priority of Japanese Patent Application No. 2020-212682, filed on Dec. 22, 2020, the disclosure of which is incorporated herein by reference.

TECHNICAL FIELD

The present disclosure generally relates to an electronic device comprising a mold package.

BACKGROUND INFORMATION

A conventional mold package includes metal islands, electronic components, leads connected to the electronic components, and a mold resin that integrally seals them and exposes part of the island and part of the lead. A substrate is provided with a first metal land facing the island and a second metal land facing the lead.

The island and the first land are connected via solder. The lead and the second land are connected via solder. If the flux spreads around the solder connecting the island and the first land, the flux may come into contact with the lead or the second land.

SUMMARY

It is an object of the present disclosure to provide an electric component in which flux is suppressed from coming into contact with a lead or a second land.

The reference numerals in parentheses above indicate only a correspondence relationship with a configuration described in the embodiment in the following, and do not limit the technical scope in any way.

BRIEF DESCRIPTION OF DRAWINGS

Objects, features, and advantages of the present disclosure will become more apparent from the following detailed description made with reference to the accompanying drawings, in which.

DETAILED DESCRIPTION

Figure 1:
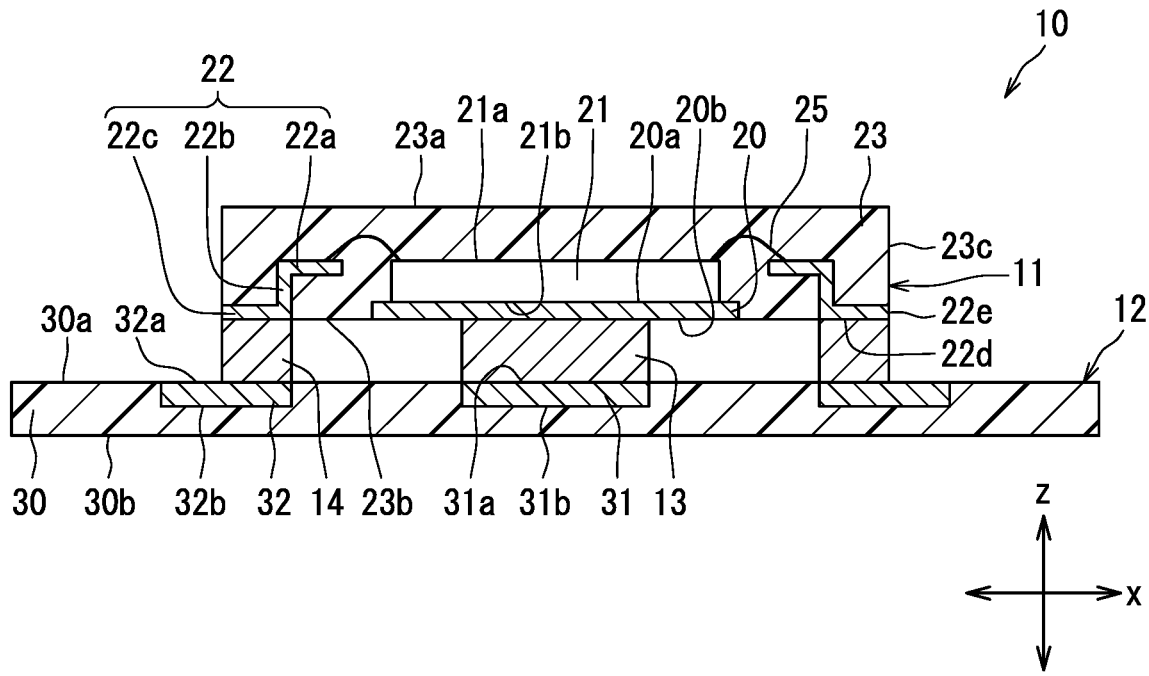
FIG. 1 is a cross-sectional view of an electric component excluding a sealing portion before reflow processing.

Hereinafter, a plurality of embodiments of the present disclosure are described with reference to the drawings. In each embodiment, portions corresponding to the elements described in the preceding embodiments are denoted by the same reference numerals, and redundant explanation may be omitted. When only a part of the configuration is described in the embodiments, the other part of the configuration can be understood as having the configuration of the preceding embodiments.

In addition, not only the combination of the parts that are explicitly indicated as combinable with other embodiments is possible in each embodiment, but also the combinations of the two or more embodiments, the embodiment and the modification, and the two or more modifications are also possible in part or in their entirety.

First Embodiment

As shown in FIGS. 1 to 4, an electric component 10 includes a semiconductor component 11, a wiring board 12, a first solder 13 and a second solder 14 connecting the semiconductor component 11 and the wiring board 12, and a sealing portion 26. The electric component 10 has a QFN (Quad Flat Non-leaded Package) structure.

The mechanical configuration of the electric component 10 is described below. In describing the configuration, three directions orthogonal to each other are defined as the x direction, the y direction, and the z direction. In the drawings, the description of "direction" is omitted. The z direction corresponds to an alignment direction.

<Semiconductor Component>

First, the semiconductor component 11 is described. As shown in FIGS. 1 to 5, the semiconductor component 11 includes a heat radiating portion 20, a semiconductor element 21, a plurality of lead terminals 22, and a coating resin 23.

The heat radiating portion 20 has a flat shape having a thin thickness in the z direction. The heat radiating portion 20 is formed of a conductive metal member. The heat radiating portion 20 has a square shape having the same length in the x direction and the y direction. Note that the heat radiating portion 20 does not have to be in a square shape.

The heat radiating portion 20 has a heat radiating upper surface 20a and a heat radiating lower surface 20b on the back side of the heat radiating upper surface 20a, i.e., two surfaces in alignment arrangement in the z direction. When describing semiconductor devices, as shown in FIG. 1, the direction towards the top of the page is usually (arbitrarily) defined as "positive z direction", or vertically upward. The x-y plane (orthogonal to the z direction) is usually defined as a horizontal plane. Also, usually a positive z axis (or central axis) is defined as passing upward through a center of the semiconductor device.

The semiconductor element 21 may be fixed to the heat radiating upper surface 20a via a connecting member such as Ag paste. Therefore, the heat generated from the semiconductor element 21 can be dissipated to the heat radiating portion 20.

The semiconductor element 21 is an element formed on a semiconductor substrate such as silicon (not shown). In the present embodiment, an IC chip is used as the semiconductor element 21.

The semiconductor element 21 has a flat shape having a thin thickness in the z direction. The semiconductor element 21 has a semiconductor upper surface 21a and a semiconductor lower surface 21b.

A bonding wire 25 that electrically connects the semiconductor element 21 and one of lead terminals 22 is connected to the semiconductor upper surface 21a.

The semiconductor lower surface 21b is aligned with the heat dissipation upper surface 20a to face each other in the z direction. The semiconductor lower surface 21b and the heat radiating upper surface 20a are fixed via a connecting member such as the Ag paste described above.

The lead terminal 22 is a conductive terminal for external connection in the semiconductor component 11. The lead terminal 22 has a first extension portion 22a extending in the x direction, a second extension portion 22b connected to one end of the first extension portion 22a and extending in the z direction, and a third extension portion 22c connected to the other, far side end of the second extension portion 22b and extending in the x direction.

Each of the plurality of lead terminals 22 is provided along an outer circumference of the semiconductor element 21 relative to the central axis. Each of the plurality of lead terminals 22 is electrically connected via the bonding wire 25 described above.

The coating resin 23 is formed of a molding material containing, for example, an epoxy resin. The heat radiating portion 20, the semiconductor element 21, the plurality of lead terminals 22, and the bonding wire 25 are integrally sealed in the coating resin 23. A part of the heat radiating portion 20 and a part of each of the plurality of lead terminals 22 are exposed from the coating resin 23.

The coating resin 23 has a flat shape. The coating resin 23 has a coating upper surface 23a, and a coating lower surface 23b.

As described above, a lower part of the heat radiating portion 20 and a lower part of each of the plurality of lead terminals 22 are exposed from the coating resin 23. More specifically, the heat radiating lower surface 20b and a lower surface of a part of the third extension portion 22c of each of the plurality of lead terminals 22 are exposed from the coating lower surface 23b.

A lower surface of a part of the third extension portion 22c of each of the plurality of lead terminals 22 is downwardly exposed from a coating connecting surface 23c connecting the coating upper surface 23a and coating lower surface 23b.

Hereinafter, for the sake of simplicity, a lower surface of a part of the third extension portion 22c exposed from the coating lower surface 23b is referred to as a third extension exposed lower surface 22d. A side surface of a part of the third extension portion 22c exposed from the coating connecting surface 23c is referred to as a third extension exposed side surface 22e. Note that the third extension exposed side surface 22e may alternatively be not exposed from the coating connecting surface 23c.

Further, as shown in FIGS. 1 to 4, the coating lower surface 23b, the heat radiating lower surface 20b, and the third extension exposed lower surface 22d are flush with each other in the z direction. The coating connecting surface 23c and the third extension exposed side surface 22e are flush with each other.

<Wiring Board>

Next, the wiring board 12 is described. The wiring board 12 is a board/substrate on which the semiconductor component 11 is mounted. The wiring board 12 has an insulating substrate 30 made of resin or the like, a first land 31, and a plurality of second lands 32.

Each of the first land 31 and the plurality of second lands 32 is formed of a conductive metal member. The first land 31 and the plurality of second lands 32 are each inserted into (or onto) the insulating substrate 30 to form the wiring board 12. The first land 31 corresponds to the first mounting portion. The second land 32 corresponds to the second mounting portion.

The insulating substrate 30 has a flat shape having a thin thickness in the z direction. The insulating substrate 30 has an insulating upper surface 30a and an insulating lower surface 30b. Although not shown, wiring made of a conductor is arranged on the insulating upper surface 30a. The semiconductor component 11 is provided on an insulating upper surface 30a side of the wiring board 12 via the first solder 13 and the second solder 14.

The first land 31 has a flat shape having a thin thickness in the z direction. The first land 31 forms a square having the same length in the x direction and the y direction. Note that the first land 31 does not have to form a square.

The first land 31 has a first upper surface 31a and a first lower surface 31b on the back side of the first upper surface 31a, i.e., two surfaces 31a, 31b arranged in the z direction. The first land 31 is provided at the center of the insulating substrate 30 in the x-direction and the y-direction, respectively.

The first land 31 is provided on the insulating substrate 30 so as to be aligned with the heat radiating portion 20 of the semiconductor component 11 in the z direction. The first solder 13 is applied to the first upper surface 31a of the first land 31. The heat radiating portion 20 is electrically and mechanically connected to the first land 31 via the first solder 13. Note that the first solder 13 is described in detail later.

Further, the width of the first land 31 in the x direction is smaller than the width of the heat radiating portion 20 in the x direction. The width of the first land 31 in the y direction is smaller than the width of the heat radiating portion 20 in the y direction. As shown in FIGS. 1 to 5, the heat radiating portion 20 and the first land 31 substantially overlap each other via the first solder 13 in the z direction.

The second land 32 also has a flat shape having a thin thickness in the z direction. Each of the plurality of second lands 32 has a second upper surface 32a and a second lower surface 32b. A plurality of second lands 32 are provided on the insulating substrate 30 along the outer circumference of the first land 31 along the circumferential direction.

The second land 32 is provided on the insulating substrate 30 so as to be aligned with a part of the third extension portion 22c of the lead terminal 22 in the z direction. An end of the second land 32 in the x direction is positioned farther away from the semiconductor element 21 with respect to the third extension portion 22c. The second solder 14 is applied to the second upper surface 32a of the second land 32. The third extension portion 22c is electrically and mechanically connected to the second land 32 via the second solder 14. Note that the second solder 14 is described in detail later.

Note that, as shown in FIGS. 1 to 4, the first land 31 and the second land 32 are provided on the wiring board 12 so that the first upper surface 31a, the second upper surface 32a, and the insulating upper surface 30a are flush with each other in the z direction.

<First Solder and Second Solder>

The first solder 13 is a solder, from among soldering that connects the semiconductor component 11 and the wiring board 12, provided at a position between the heat radiating portion 20 and the first land 31 for electrically and mechanically connecting the heat radiating portion 20 and the first land 31.

In the following, the paste-like solder before reflow, which is described later, provided at a position between the heat radiating portion 20 and the first land 31 is referred to as the first solder 13. The first solder 13 is separated into a first solder connecting portion 13a and a first flux 13b (see FIG. 2) by the reflow process. By the reflow processing, the heat radiating portion 20 and the first land 31 are electrically and mechanically connected by the first solder connecting portion 13a. The first flux 13b is provided around the first solder connecting portion 13a. The first solder connecting portion 13a corresponds to a solder connecting portion. The first flux 13b corresponds to a flux.

Figure 4:
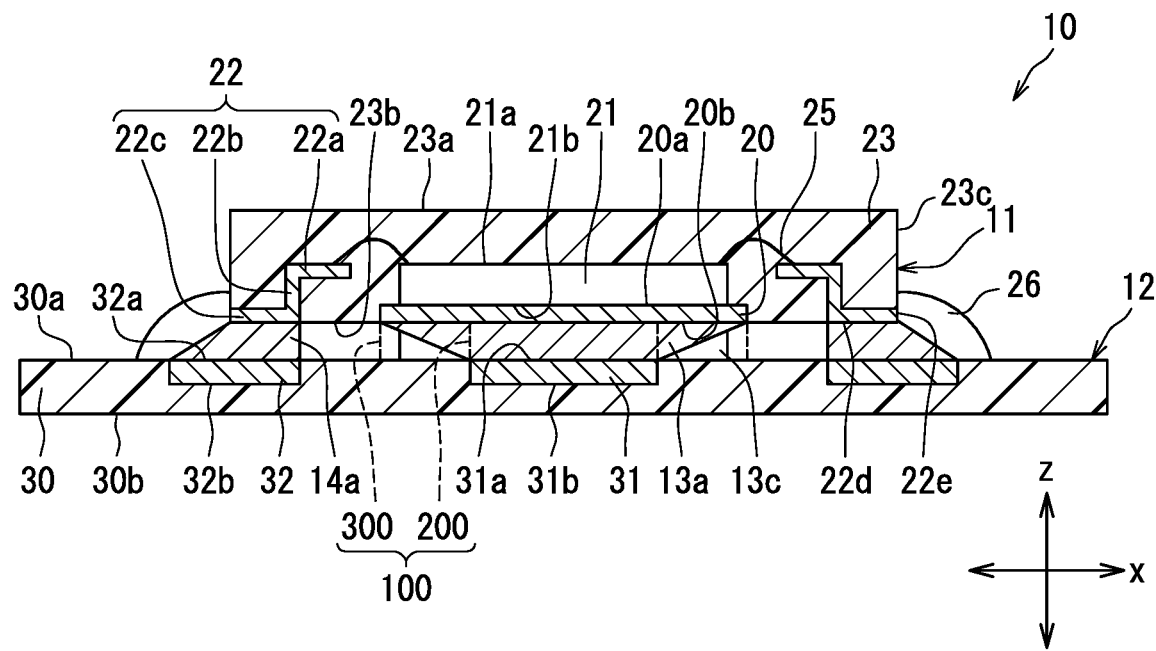
FIG. 4 is a cross-sectional view of the electric component.

As shown in FIG. 4, the heat radiating portion 20 and the first land 31 overlap each other via the first solder connecting portion 13a. As described above, the heat radiating portion 20 and the first land 31 each form a square. Therefore, the first solder connecting portion 13a has a regular square pyramid pedestal shape, and electrically and mechanically connects the first land 31 and the heat radiating portion 20.

Figure 3:
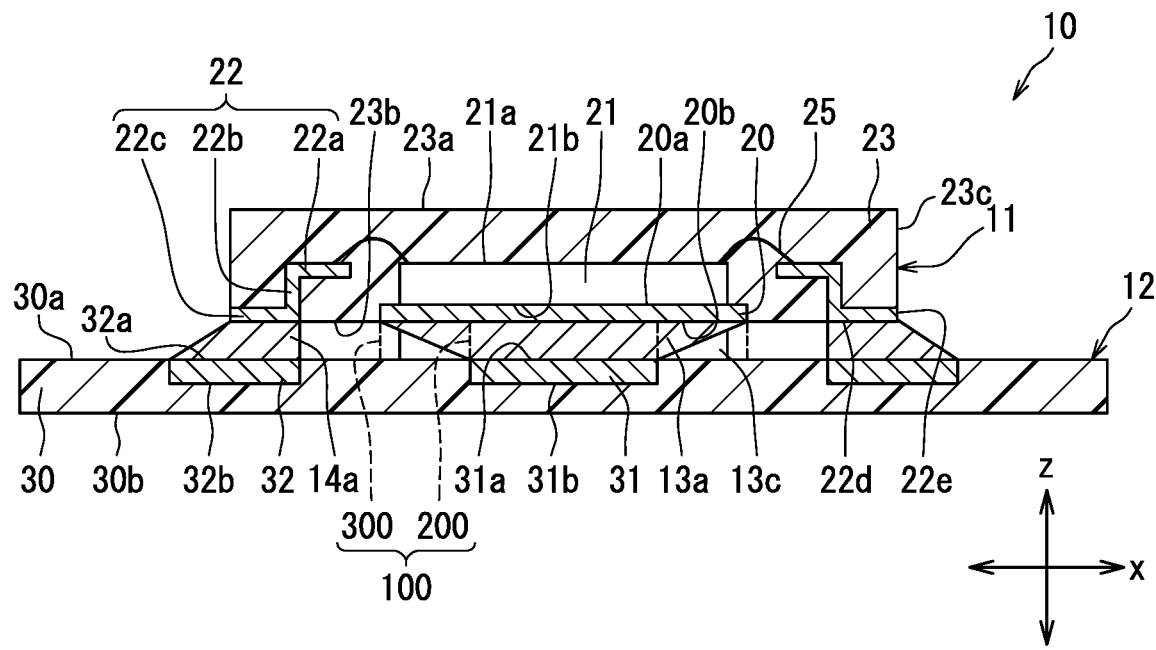
FIG. 3 is a cross-sectional view of the electric component excluding the sealing portion after reflow processing.

In the following, as shown in FIGS. 3 and 4, a space between the heat radiating portion 20 and the wiring board 12 in the z direction after the reflow is referred to as a first space 100. A space in which the heat radiating portion 20 and the first land 31 of the first space 100 overlap in the z direction is referred to as a second space 200. A space defined as a rest/residue of the first space 100 after excluding the second space 200 therefrom, (a) which surrounds the second space 200 about the z direction and (b) which may also be describable as a circumferential, non-overlapping space regarding the heat radiating portion 20 and the first land 31. In other words, the first space 100 is the volume defined by the heat radiating portion projecting directly downward to a central portion of the wiring board 12. The second space 200 is defined by the first land 31 projecting directly upward to a central portion of the heat radiating portion 20. The third space 300 is defined by subtracting the second space 200 from the first space 100. The third space 300 has a vertical annulus corresponding to the subtracted second space 200.

The first solder connecting portion 13a occupies a part of the third space 300 and also occupies all of the second space 200. All of the first flux 13b is provided inside of an unoccupied space in the third space 300, which is not occupied by the first solder connecting portion 13a.

Figure 6:
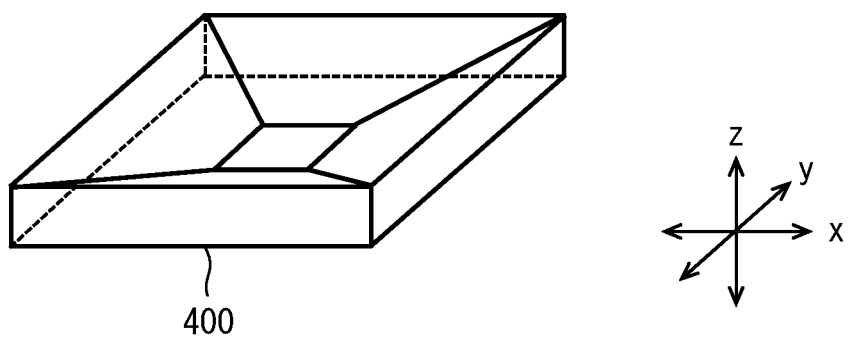
FIG. 6 is a perspective view for explaining a fourth space.

Specifically, a fourth space 400 is defined as the third space 300 minus a space occupied by the first flux residue 13c. Note that the fourth space 400 has a shape as shown in FIG. 6.

The second solder 14 is a solder provided at a position between the lead terminal 22 and the second land 32 for electrically and mechanically connecting the lead terminal 22 and the second land 32.

In the following, the paste-like solder before reflow, which is described later, provided at a position between the lead terminal 22 and the second land 32 is referred to as the second solder 14. The second solder 14 is separated into a second solder connecting portion 14a and a second flux (not shown) by the reflow process.

As described above, the second land 32 is provided on the insulating substrate 30 so as to be aligned with a part of the third extension portion 22c of the lead terminal 22 in the z direction. Further, an end of the second land 32 in the x direction is positioned farther away from the semiconductor element 21 with respect to the third extension portion 22c. Therefore, the second solder connecting portion 14a has a substantially square pyramid pedestal shape, and electrically and mechanically connects the second land 32 and the third extension portion 22c.

<Sealing Portion>

Figure 5:
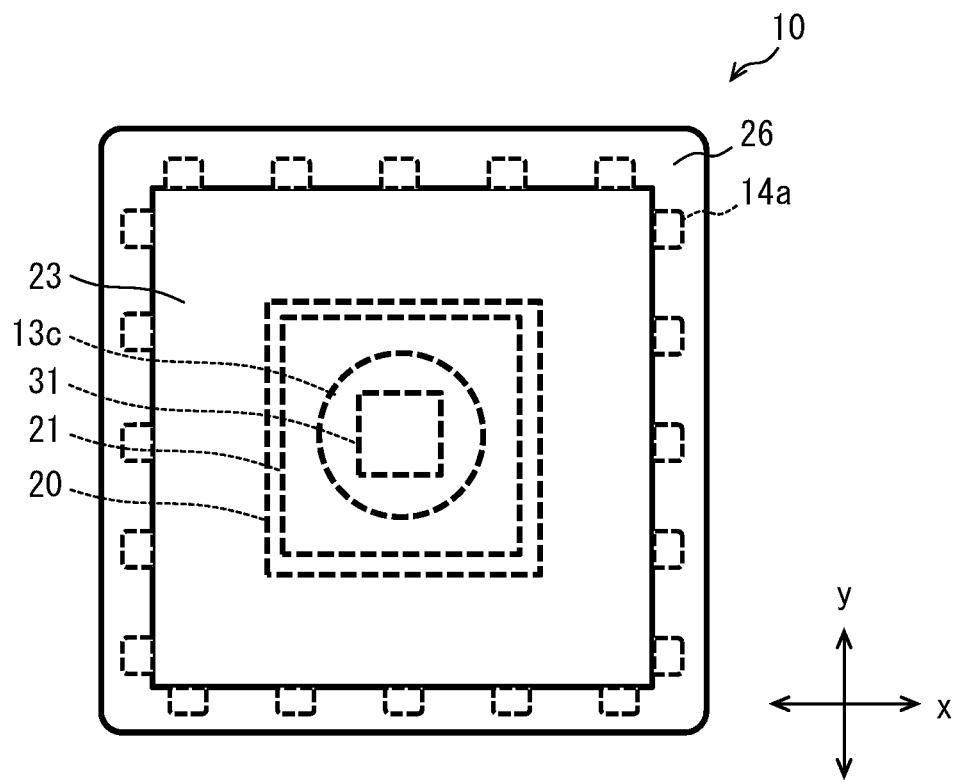
FIG. 5 is a top view of the electric component.

The sealing portion 26 is a thermosetting resin containing an epoxy resin or the like provided on the wiring board 12 in order to suppress a decrease in the life of the solder. The sealing portion 26 has an insulating property. As shown in FIGS. 4 and 5, the sealing portion 26 is provided along the outer circumference of the semiconductor component 11 along the circumferential direction relative to the central axis, so as to cover the third extension portion 22c and the second solder 14.

<Manufacturing Method of Electric Component>

The manufacturing method of the electric component 10 is described below. First, the semiconductor component 11 and the wiring board 12 are prepared.

Next, the first solder 13 is applied to the first upper surface 31a of the first land 31 by screen printing or the like. Similarly, the second solder 14 is applied to the second upper surface 32a of the second land 32 by screen printing or the like. Note that, at the time of screen printing, the first solder 13 and the second solder 14 are in a form of a paste.

Next, the semiconductor component 11 is mounted on the wiring board 12. More specifically, the heat radiating portion 20 is mounted on the first land 31 so that the heat radiating lower surface 20b adheres to the first solder 13. At the same time, the third extension portion 22c is mounted on the second land 32 so that the third extension exposed lower surface 22d adheres to the second solder 14.

Next, reflow processing is performed. Reflow processing is a process in which solder paste is printed on a joining portion of a board, and electronic components are mounted on it, and then the solder is melted with infrared rays or hot air to electrically and mechanically connect the electronic components to the board.

In the present embodiment, the heat radiating portion 20 is electrically and mechanically connected to the first land 31 by the first solder connecting portion 13a. The second solder connecting portion 14a electrically and mechanically connects the third extension portion 22c to the second land 32.

Figure 2:
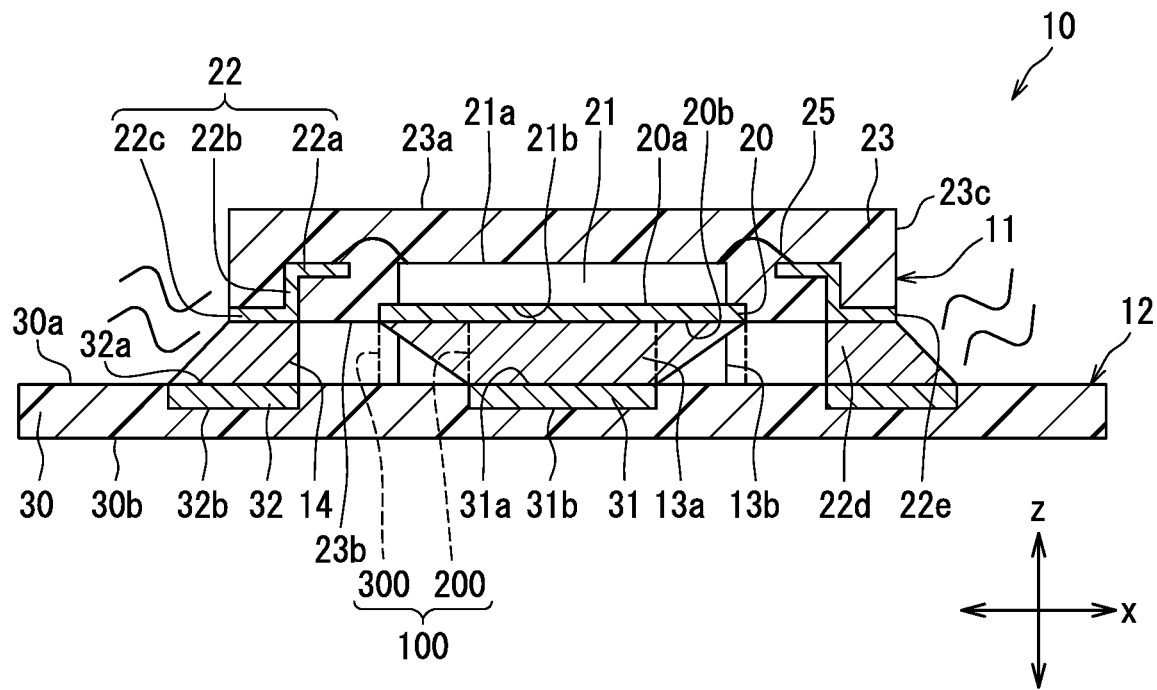
FIG. 2 is a cross-sectional view of the electric component excluding the sealing portion during a reflow process.

When the reflow processing is performed, as shown in FIG. 2, the first solder 13 wets and spreads on the first upper surface 31a of the first land 31 and the heat radiating lower surface 20b of the heat radiating portion 20. The heat radiating portion 20 and the first land 31 overlap in the z direction via the first solder connecting portion 13a. Further, the heat radiating portion 20 and the first land 31 form a square shape. Therefore, the first solder connecting portion 13a forms a regular square pyramid pedestal shape, and electrically and mechanically connects the first land 31 and the heat radiating portion 20.

When the reflow processing is performed in the same manner, the second solder 14 wets and spreads on the second upper surface 32a of the second land 32 and the third extension exposed lower surface 22d of the third extension portion 22c. As described above, the second land 32 is provided on the insulating substrate 30 so as to be aligned with a part of the third extension portion 22c of the lead terminal 22 in the z direction. Further, an end of the second land 32 in the x direction is positioned farther away from the semiconductor element 21 with respect to the third extension portion 22c. Therefore, the second solder connecting portion 14a has a substantially square pyramid pedestal shape, and electrically and mechanically connects the third extension portion 22c of the lead terminal 22.

Next, the sealing portion 26 is applied along the outer circumference of the semiconductor component 11 along the circumferential direction so as to cover the third extension portion 22c and the second solder connecting portion 14a.

Next, the sealing portion 26 is heated. The sealing portion 26 is cured by being heated. Therefore, the second solder connecting portion 14a is protected by the sealing portion 26.

<Solder and Reflow Processing>

When the reflow processing is performed, a liquid first flux 13b dissolves from the first solder 13. The melted first flux 13b wets and spreads around the first solder connecting portion 13a toward an end side (i.e., toward a periphery) of the wiring board 12. In the present embodiment, the first flux 13b is contained in the fourth space 400 excluding the occupied area of the first solder connecting portion 13a from the first space 100.

When heating proceeds further in such a state, the liquid component volatilizes from the first flux 13b. As a result, a first flux residue 13c is deposited in the wet and spread region of the first flux 13b. The first flux residue 13c corresponds to a flux residue.

In the present embodiment, as shown in FIGS. 3 and 4, the first flux residue 13c is contained in the fourth space 400 excluding the occupied area of the first solder connecting portion 13a from the first space 100. The relationship between the length of one side of the first land 31 and the length of one side of the heat radiating portion 20 in such case is described in detail later below.

Similarly, when the reflow processing is performed, the liquid second flux (not shown) dissolves from the second solder 14. The melted second flux wets and spreads on the wiring board 12 around the second solder connecting portion 14a. When heating proceeds further in such a state, the liquid component volatilizes from the second flux. As a result, the second flux residue is deposited in the wet and spread region of the second flux.

By undergoing the reflow processing in such manner, the first flux 13b dissolves from the first solder 13. The second flux dissolves from the second solder 14. Therefore, the volumes of the first solder 13 and the second solder 14 are reduced (not shown) as compared with those at the time of printing.

Note that, in the present embodiment, a separation distance between the two adjacent lead terminals 22 is such that the second flux melted from two adjacent second solders 14 printed on two adjacent lead terminals 22 does not merge. In such case, a short circuit due to the second flux is less likely to occur.

Therefore, in the following, the first flux residue 13c deposited in the wet and spread region of the first flux 13b is mainly described. Note that the separation distance between the two adjacent lead terminals 22 may be not so great, i.e., may allow merging of the second flux melted from the second solder 14 printed on the two adjacent lead terminals 22.

<Volume of First Flux Residue and Fourth Space>

The above-mentioned first flux residue 13c is calculated by an equation shown below. Accordingly, the length of one side of the first land 31 in each of the x direction and the y direction is designated as "a" (mm). For rectangles, an average length may be used, or a length of a square with an equivalent area may be used. Further, the thickness in the z direction of each of the first solder and the second solder before the reflow processing is designated as "b" (mm). Further, the solder density of each of the first solder and the second solder before the reflow processing is designated as "c" (g/cm³). The content ratio of the first flux 13b in the first solder before the reflow processing and the content ratio of the second flux in the second solder before the reflow processing is designated as "d" (wt %). The ratio of the first flux residue 13c contained in the first flux 13b is designated as "e" (wt %). The density of the first flux residue 13c is designated as "f" (g/cm³). The density of the first solder connecting portion 13a after the reflow processing is designated as "g" (g/cm³). The length of one side of the heat radiating portion 20 in each of the x direction and the y direction is designated as "h" (mm).

According to the above, a volume x1 (mm³) of the first flux residue of the first flux residue 13c can be shown in Equation 1.

$$x_1 = \frac{a^2 b c d e}{10^4 \times f} \quad \text{(Equation 1)}$$

Further, the above-mentioned fourth space 400 is calculated by subtracting the volume of the first solder connecting portion 13a from the first space 100. In calculating the fourth space 400, a volume x2 (mm³) of the first solder connecting portion 13a can be shown in Equation 2.

$$x_2 = \frac{a^2 b c \left(1 - \frac{d}{100}\right)}{g} \quad \text{(Equation 2)}$$

As described above, the first solder connecting portion 13a has a regular square pyramid pedestal shape. Therefore, the solder thickness y (mm) of the first solder connecting portion 13a can be shown as shown in Equation 3.

$$y = \frac{3\left\{a^2 b c \left(1 - \frac{d}{100}\right)\right\}}{g \times (a^2 + a h + h^2)} \quad \text{(Equation 3)}$$

Therefore, a fourth space volume z (mm³) of the fourth space 400 can be shown in Equation 4.

$$z = h^2 y - \frac{a^2 b c \left(1 - \frac{d}{100}\right)}{g} \quad \text{(Equation 4)}$$

Figure 7:
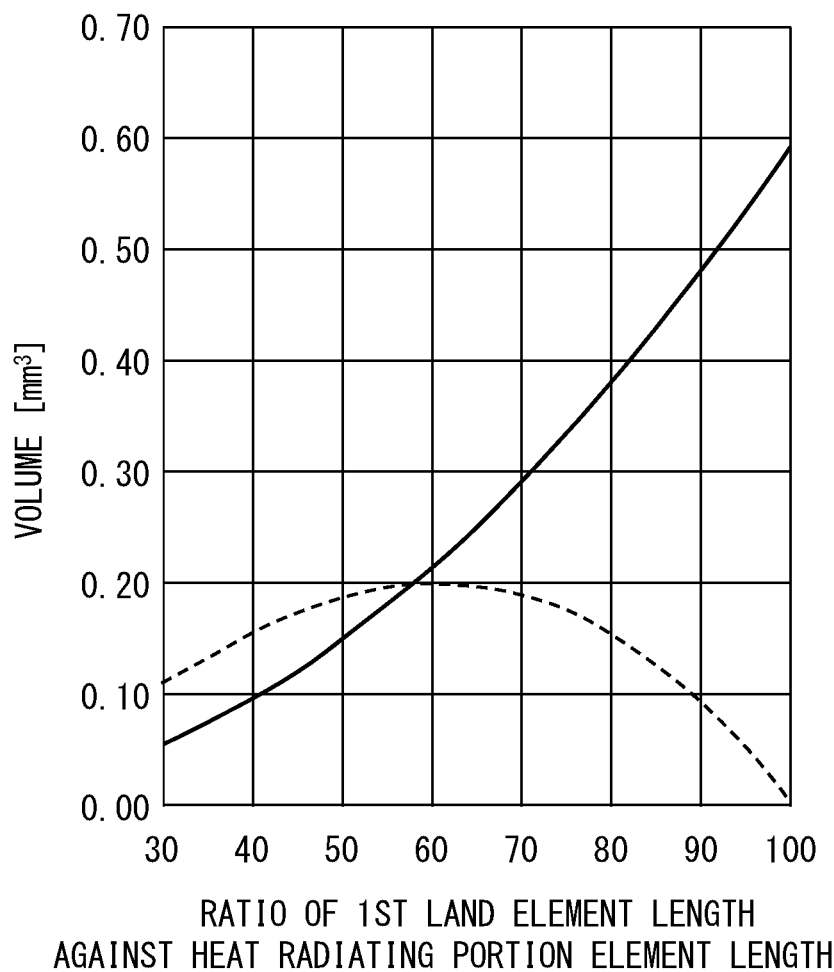
FIG. 7 is a graph showing a relationship between a ratio of an element length of a first land to an element length of a heat radiating portion, a volume of a first flux residue, and a volume of a fourth space.

Based on the above equations, FIG. 7 shows a graph of relationship between the ratio of the length of one side (i.e., element length) of the first land 31 to the length of one side (i.e., element length) of the heat radiating portion 20, the first flux residue volume x1, and the fourth space volume z of the fourth space 400.

Note that, as described above, the first land 31 has a square shape. Therefore, the length of one side in the x direction and the length of one side in the y direction are equal regarding the first land 31. In FIG. 7, the length of one side in the x direction and the length of one side in the y direction regarding the first land 31 are collectively shown as the length of one side of the first land 31.

Similarly, the heat radiating portion 20 has a square shape. Therefore, the length of one side in the x direction and the length of one side in the y direction are equal regarding the heat radiating portion 20. In FIG. 7, the length of one side in the x direction and the length of one side in the y direction regarding the heat radiating portion 20 are collectively shown as the length of one side of the heat radiating portion 20.

Note that, in FIG. 7, the first flux residue volume x1 is shown by a solid line, and the fourth space volume z of the fourth space 400 is shown by a broken line.

The first flux residue volume x1 increases as the ratio of the length of one side of the first land 31 to the length of one side of the heat radiating portion 20 increases. The fourth space volume z increases up to around 60% and decreases thereafter, in terms of the ratio of the length of one side of the first land 31 to the length of one side of the heat radiating portion 20.

Further, a curve showing the first flux residue volume x1 and a curve showing the fourth space volume z intersect with each other in a region where the ratio of the length of one side of the first land 31 to the length of one side of the heat radiating portion 20 is smaller than 60%.

As described above, in the present embodiment, the first flux residue 13c is provided in the fourth space 400. That is, the first flux residue volume x1 is smaller than the fourth space volume z.

In other words, in the region where the first flux residue volume x1 is smaller than the fourth space volume z, the length of one side of the first land 31 is shorter than the length of one side of the heat radiating portion 20. That is, the first land 31 ("a) is smaller than the heat radiating portion 20 ("h") so that the first flux residue volume x1 becomes smaller than the fourth space volume z.

<Operational Effects>

In the present embodiment, as described above, all/entirety of the first flux 13b is provided in the fourth space 400 excluding the occupied area occupied by the first solder connecting portion 13a from the first space 100. In other words, all/entirety of the first flux 13b is provided in the unoccupied space not occupied by the first solder connecting portion 13a in the third space 300. Therefore, the contact of the first flux 13b with the second land 32 is suppressed. That is, the first flux 13b coming into contact with the lead terminal 22 is suppressed.

Further, the third space 300 has an annular shape that surrounds the second space 200. Further, all/entirety of the first flux 13b is provided in the unoccupied space not occupied by the first solder connecting portion 13a in the third space 300. Therefore, the first flux 13b coming into contact with all of the plurality of second lands 32 provided along the outer circumference of the first land 31 in the circumferential direction is suppressed. Further, the first flux 13b coming into contact with all the portions exposed from the coating resin 23 of the plurality of lead terminals 22 provided along the outer circumference of the heat radiating portion 20 in the circumferential direction is suppressed.

As described above, all/entirety of the first flux residue 13c is provided in the fourth space 400 excluding the occupied area occupied by the first solder connecting portion 13a from the first space 100. In other words, all/entirety of the first flux residue 13c is provided in the unoccupied space not occupied by the first solder connecting portion 13a in the third space 300. According to such configuration, the first flux residue 13c coming into contact with each of the second land 32 and the lead terminal 22 is suppressed.

The first flux residue 13c may be cracked due to mechanical bending, thermal stress, or the like. If water enters the crack, a water channel may be formed between the plurality of lead terminals 22. If a voltage is applied between the plurality of lead terminals 22 in such state, ion migration may occur in which the metal derived from the lead terminals 22 ionized between the plurality of lead terminals 22 moves in the water channel. Therefore, there is a possibility that a short circuit may occur between the plurality of lead terminals 22. There may also be a possibility that a short circuit occurs between the plurality of second lands 32 on the same principle between the plurality of second lands 32.

In the present embodiment, as described above, the configuration makes it hard for the first flux residue 13c to come into contact with the lead terminal 22 and the second land 32. Therefore, the above-mentioned ion migration hardly occurs. As a result, a short circuit hardly occurs between the plurality of lead terminals 22. Also, a short circuit hardly occurs between the plurality of second lands 32.

Further, even when a first flux removing step of removing the first flux residue 13c by pouring a cleaning liquid into the gap between the semiconductor component 11 and the wiring board 12 is not performed, the first flux residue 13c is devised to hardly coming into contact with the lead terminal 22 and the second land 32. Therefore, the first flux removing step is likely to be omissible. Further, it is easy to simplify the manufacturing process.

In the present embodiment, the first land 31 and the second land 32 are provided on the wiring board 12 so that the first upper surface 31a, the second upper surface 32a, and the insulating upper surface 30a are flush with each other in the z direction. Therefore, it is possible to narrow the gap between the wiring board 12 and the semiconductor component 11. Along with such narrowing, the physique of the electric component 10 in the z direction is reducible.

As described above, the sealing portion 26 is provided at the outer circumference of the semiconductor component 11 along the circumferential direction about the z direction to cover the third extension portion 22c and the second solder connecting portion 14a. According to such a configuration, it is easy to suppress a decrease in the life of the second solder connecting portion 14a. In addition, moisture and dust are less likely to enter a gap between the semiconductor component 11 and the wiring board 12.

(First Modification)

In the present embodiment (i.e., first embodiment), the sealing portion 26 is applied to the outer circumference of the semiconductor component 11 so as to cover the second solder connecting portion 14a. However, the sealing portion 26 may be provided in a gap between the wiring board 12 and the semiconductor component 11 in addition to the outer circumference of the semiconductor component 11. According to such a configuration, it is easy to suppress a decrease in the life of each of the first solder connecting portion 13a and the second solder connecting portion 14a.

(Other Modifications)

In the present embodiment, a configuration in which the first land 31 has a square shape has been described. Similarly, the heat radiating portion 20 having a square shape has also been described. However, the first land 31 and the heat radiating portion 20 may have other shapes other than the square shape.

It may be sufficient that all/entirety of the first flux residue 13c is provided in the fourth space 400 excluding the occupied area occupied by the first solder connecting portion 13a from the first space 100. Although not shown, the first upper surface 31a of the first land 31, the second upper surface 32a of the second land 32, and the insulating upper surface 30a of the wiring board 12 may be not flush with each other in the z direction.

What is claimed is:

1. An electric component comprising:
   a semiconductor component including:
   a heat radiating portion made of metal,
   a semiconductor element provided in or on the heat radiating portion,
   a lead terminal connected to the semiconductor element, and a coating resin coating at least part of each of: (i) the heat radiating portion, (ii) the lead terminal, and (iii) the semiconductor element;
a wiring board including
a first mounting portion made of metal and is located below the heat radiating portion,
a second mounting portion made of metal that is located at least partially below an exposed portion of the lead terminal, wherein the portion of the lead terminal is overlapped with the second mounting portion, and
an insulating substrate supporting the first mounting portion and the second mounting portion;
a first solder connecting the first mounting portion and the heat radiating portion; and
a second solder connecting the second mounting portion and the exposed portion of the lead terminal, and
wherein:
the first solder includes: (a) a first solder connecting portion connecting the heat radiating portion and the first mounting portion, and (b) a first flux contacting a side of first solder connecting portion and contacting the insulating substrate,
a first space is a first volume defined by the heat radiating portion projecting directly downward to a central portion of the wiring board,
a second space is a second volume defined by the first mounting portion projecting directly upward to a central portion of the heat radiating portion,
a third space is a third volume defined by subtracting the second space from the first space, the first solder connecting portion occupies substantially all of the second space and occupies a portion of the third space, and
the first flux is located within an unoccupied portion of the third space that is not occupied by the first solder.

2. The electric component of claim 1, wherein
the first flux includes a first flux residue having less liquid component than a center portion of the first flux, and
the first flux residue is located within the unoccupied portion of the third space that is not occupied by the first solder.

3. The electric component of claim 1, wherein
the first mounting portion is inserted into the insulating substrate, and
an insulating upper surface of the insulating substrate and a first upper surface of the first mounting portion are flush with each other.

4. The electric component of claim 1, further comprising:
an insulating sealing portion for sealing (i) an exposed portion of the lead terminal exposed from the coating resin and (ii) the second solder.

5. The electric component of claim 1, wherein
a cross sectional area of the first solder connecting portion reduces from the heat radiating portion toward the first mounting portion in an arrangement direction in which the heat radiating portion and the semiconductor element are arranged.

6. The electric component of claim 1, wherein
in the third space, the first solder connecting portion overlaps the first flux in an arrangement direction in which the heat radiating portion and the semiconductor element are arranged.

7. The electric component of claim 1, wherein
the third space comprises an annular shape that surrounds the second space.

8. The electric component of claim 1, wherein
the first solder connecting portion comprises a regular square pyramid pedestal shape.

9. An electronic component comprising:
a wiring board including:
(i) an insulating substrate including an insulating upper surface,
(ii) a first land including a first upper surface, and
(iii) second land including a second upper surface;
a semiconductor component including:
(i) a heat radiating portion including a heat radiating lower surface and a heat radiating upper surface,
(ii) a semiconductor element including a semiconductor lower surface in thermal communication with the heat radiating upper surface of the heat radiating portion,
(iii) a lead terminal in electrical communication the semiconductor element, and including an extension exposed lower surface, and
(iv) a coating resin coating portions of: the heat radiation portion, the semiconductor element, and the lead terminal;
a first solder connecting portion connecting substantially all of the first upper surface to substantially all of the heat radiating lower surface,
a second solder connecting portion connecting substantially all of the second upper surface to substantially all of the extension exposed lower surface, and
a first flux residue bounded on a substantially diagonal upper surface by a portion of the first solder connecting portion, and bounded on a lower surface by the insulating upper surface.

10. The electronic component of claim 9, wherein, when viewed vertically:
the heat radiating lower surface completely overlaps the first upper surface, and a perimeter of the heat radiating lower surface completely surrounds a perimeter of the first upper surface.

11. The electronic component of claim 10, wherein, when viewed vertically:
the second upper surface completely overlaps the extension exposed lower surface, and
a portion of the second upper surface extends horizontally outwardly beyond the extension exposed lower surface.

12. The electronic component of claim 11, wherein
the first solder connecting portion forms a truncated square pyramid having a base surface contacting the heat radiating lower surface and having truncated surface contacting the first upper surface.

13. The electronic component of claim 12, wherein
the insulating upper surface, the second upper surface, and the first upper surface are all coplanar.

14. The electronic component of claim 9, wherein
a first space is a first volume defined by the heat radiating portion projecting directly downward to a central portion of the wiring board,
a second space is a second volume defined by the wiring board and projecting directly upward to a central portion of the heat radiating portion,
a third space is a third volume defined by subtracting the second space from the first space, the first solder connecting portion occupies substantially all of the second space and occupies a portion of the third space, and
the third space comprises an annular shape that surrounds the second space.

15. The electronic component of claim 9, wherein the first solder connecting portion comprises a regular square pyramid pedestal shape.

* * * * *